United States Patent
Miyashita

(10) Patent No.: US 6,876,149 B2
(45) Date of Patent: Apr. 5, 2005

(54) DOUBLE-FACE LED DEVICE FOR AN ELECTRONIC INSTRUMENT

(75) Inventor: Shinichi Miyashita, Yamanashi-ken (JP)

(73) Assignee: Citizen Electronics Co., Ltd., Yamanashi-ken (JP)

( * ) Notice: Subject to any disclaimer, the term of this patent is extended or adjusted under 35 U.S.C. 154(b) by 0 days.

(21) Appl. No.: 10/349,028

(22) Filed: Jan. 23, 2003

(65) Prior Publication Data

US 2003/0141813 A1 Jul. 31, 2003

(30) Foreign Application Priority Data

Jan. 31, 2002 (JP) ........................................ 2002-024811

(51) Int. Cl.[7] .............................. H01J 1/62; H01J 63/04; H01L 33/00; F21V 1/00; F21V 7/00
(52) U.S. Cl. ...................... 313/512; 313/498; 313/499; 313/501; 313/502; 257/96; 257/97; 257/98; 257/99; 362/240; 362/249; 362/296; 438/123
(58) Field of Search ................................ 313/498–512; 438/123; 257/96–99, 81, 84; 362/240, 249, 296

(56) References Cited

U.S. PATENT DOCUMENTS

| 5,623,181 | A | * | 4/1997 | Suehiro et al. ............. 313/512 |
| 6,091,192 | A | * | 7/2000 | Winsor ...................... 313/493 |
| 6,340,824 | B1 | * | 1/2002 | Komoto et al. ............... 257/99 |
| 6,466,135 | B1 | * | 10/2002 | Srivastava et al. ....... 340/815.4 |

* cited by examiner

*Primary Examiner*—Joseph Williams
*Assistant Examiner*—Matt Hodges
(74) *Attorney, Agent, or Firm*—Dennison, Schultz, Dougherty & MacDonald

(57) ABSTRACT

A double-faced LED device includes a substrate having opposed faces, a central recess formed in each of the opposed faces, a pair of electrode layers formed on each of the opposed faces, the electrode layer having a surface within the central recess formed into a reflector surface, and an LED securely mounted on the electrode layer within the central recess of each of the opposed faces, to which electric current may be applied to emit light from both of the opposed faces.

8 Claims, 5 Drawing Sheets

DOUBLE-FACE LED DEVICE FOR AN ELECTRONIC INSTRUMENT

BACKGROUND OF THE INVENTION

The present invention relates to a light-emitting diode (LED) device for an electronic instrument such as a portable telephone.

The LED device is used as an edge light for an illuminating panel as a back light for illuminating a liquid crystal display (LCD) from the underside thereof.

FIG. 7 is a plan view showing a conventional portable telephone. The portable telephone 20 has an LCD 21, three LED devices 22 for the LCD 21, a plurality of key switches 23, and a plurality of LED devices 24 for illuminating the key switches 23. Thus, a number of LED devices must be provided in the portable telephone.

SUMMARY OF THE INVENTION

An object of the present invention is to provide an LED device which may illuminate a plurality of displays.

According to the present invention, there is provided a double-faced LED device comprising, a substrate having both sides, a central recess formed in each of the both sides, a pair of electrode layers formed on a surface of each of both sides, the surface of the electrode layer on the central recess being formed into a reflector surface, and an LED securely mounted on the electrode layers on the central recess so as to be applied with an electric current.

In another embodiment of the LED device, the reflector surface of the central recess has a cone shape.

In another embodiment of the LED device, the substrate has a square shape and corner recesses at four corners, each of the electrode layers is further formed on the surfaces of the corner recesses.

In another embodiment of the LED device, the central recess is charged with a transparent resin.

In another embodiment of the LED device, the central recess is closed by a transparent sheet.

These and other objects and features of the present invention will become more apparent from the following detailed description with reference to the accompanying drawings.

DETAILED DESCRIPTION OF THE PREFERRED EMBODIMENT

Figure 1:
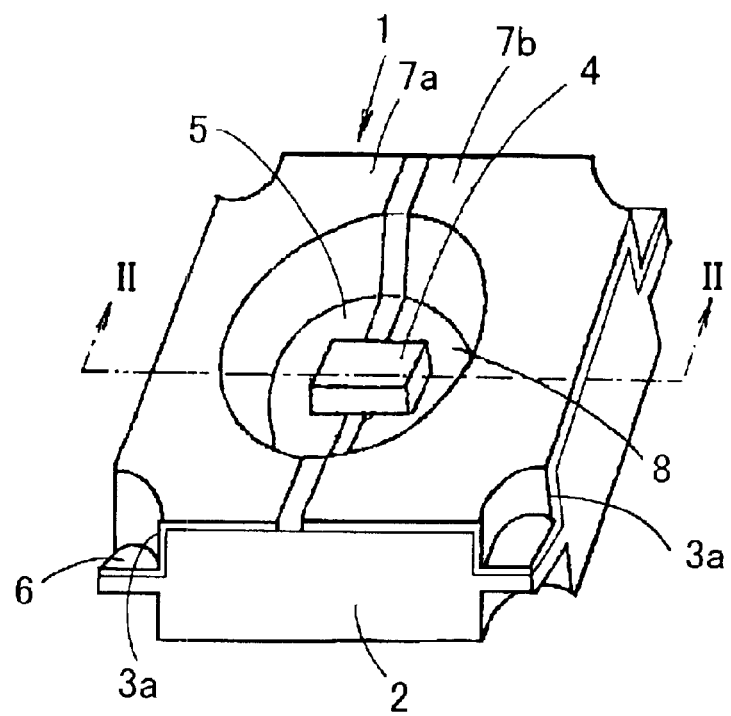
FIG. 1 is a perspective view showing an LED device as a first embodiment of the present invention.
Figure 2:
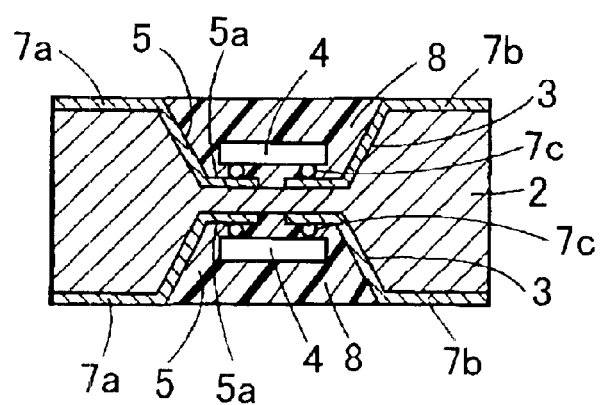
FIG. 2 is a sectional view taken alone a line II—II of FIG. 1.

Referring to FIGS. 1 and 2, a double-faced LED device 1 comprises a substrate 2 having both sides square. In each of the both sides, there are formed a central recess 3 having an inverted truncated cone shape, and corner recesses 3a at four corners. A pair of electrode layers 7a and 7b are formed on the surfaces of the central recess 3 and corner recesses 3a and the surface of the substrate 2. A surface of the electrode layer in the central recess 3 is formed into a reflector surface 5 by plating of Ag or Au, and the electrode in the corner recess 3a is formed as a terminal electrode 6.

An LED 4 is mounted on electrode layers 7a and 7b on base 5a of the recess 3 by bumps 7c so as to apply an electric current to the LED 4 from the terminal electrodes 6. A transparent resin 8 is charged in the central recess 3. In the resin 8, a fluorescent agent is included.

Thus, the LEDs 4 of the both sides of the substrate 2 are operated to emit light from both sides of the LED device 1.

Figure 3:
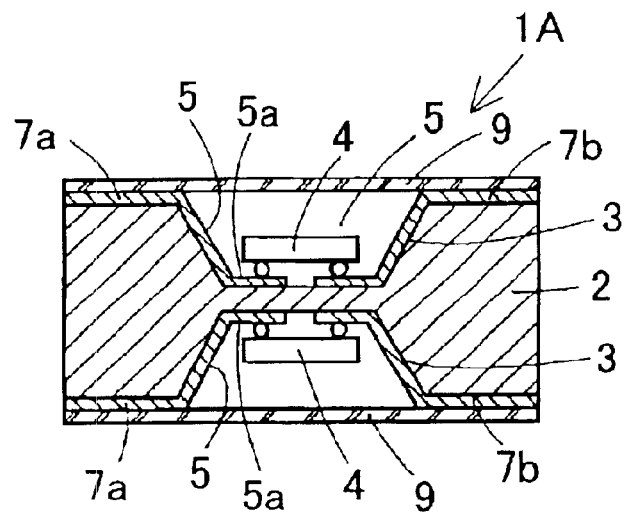
FIG. 3 is a sectional view of a second embodiment of the present invention.

FIG. 3 shows a double-faced LED device 1A of the second embodiment of the present invention. There is not provided with the transparent resin 8 in the recess 3 unlike the first embodiment, but the recess 3 is closed by a transparent sheet 9 made of transparent glass or resin. In the sheet 9, a fluorescent agent is included. Other parts are the same as the first embodiment and identified by the same reference numerals as FIG. 2.

Figure 4:
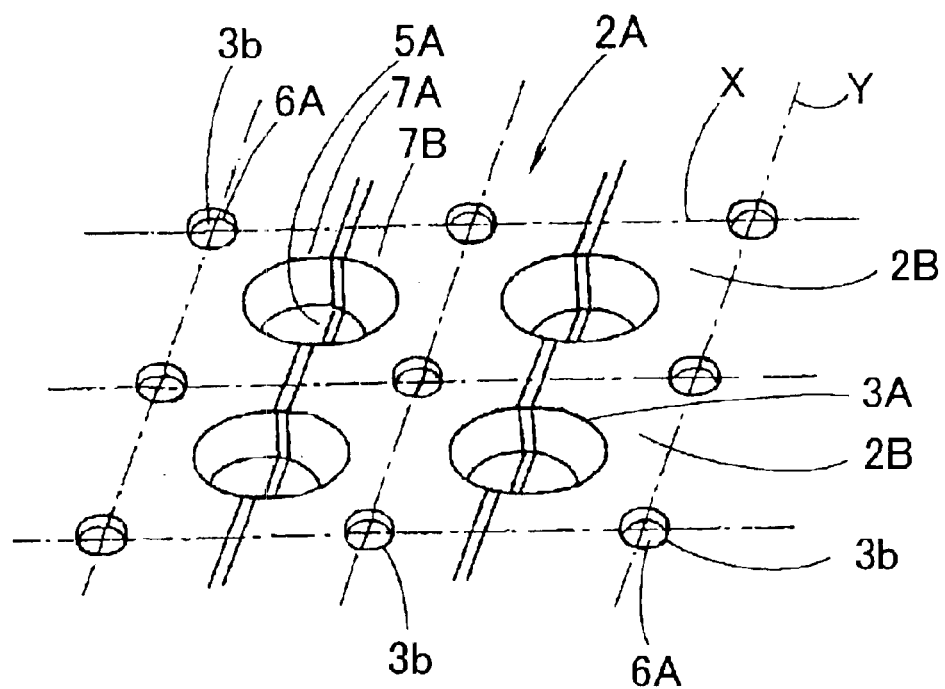
FIG. 4 is a perspective view for explaining a method for manufacturing the LED devices.

A method for manufacturing the LED devices is described hereinafter with reference to FIG. 4. A substrate assembly 2A is divided into a plurality of square areas 2B by cutting lines X, Y on both sides of the substrate. In each of the areas 2B, a recess 3A is formed at a central portion thereof, and a cylindrical recess 3b is formed at the intersection of the lines X and Y. The surface of the substrate assembly 2A, and surfaces of the recesses 3A and recesses 3b are coated with a couple of electrode layers 7A and 7B, including reflector surfaces 5A and terminal electrodes 6A. The LED 4 is mounted in each recess 3A, and transparent resin is charged in the recess 3A. Lastly, by cutting the substrate assembly 2A along the cutting lines X and Y, a plurality of LED devices are produced. Thus, LED devices can by manufactured at a low cost.

Figure 5:
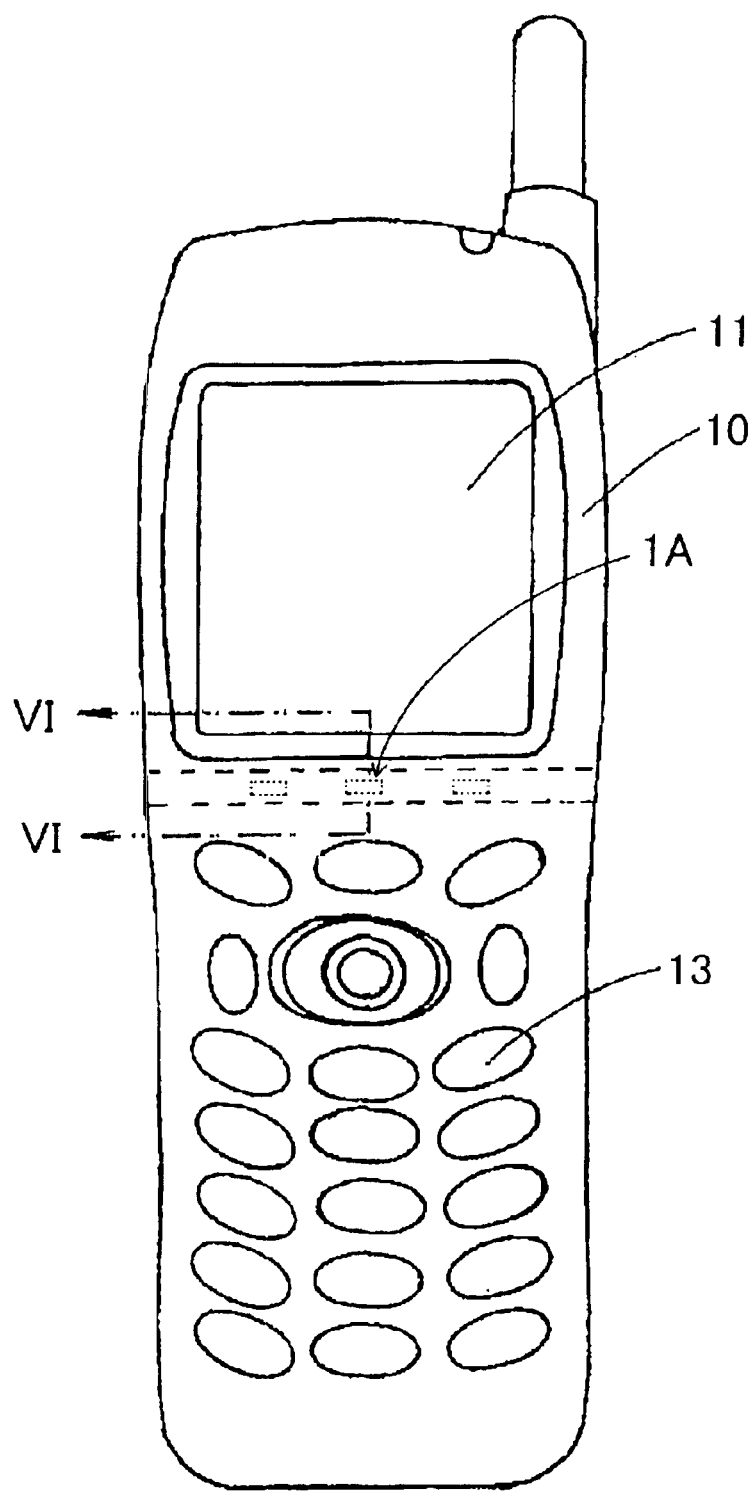
FIG. 5 is a plan view of a portable telephone in which LED devices of the second embodiment are used.
Figure 6:
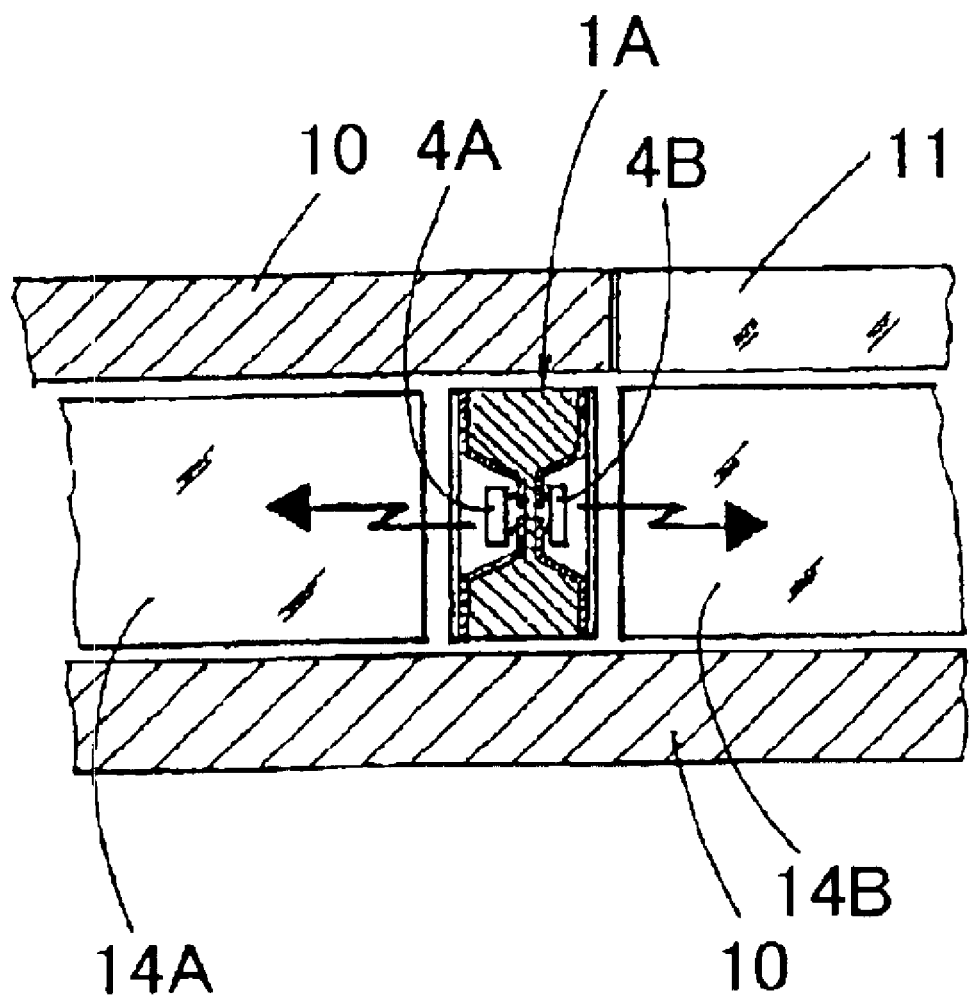
FIG. 6 is a sectional view taken along a line VI—VI of FIG. 5.
Figure 7:
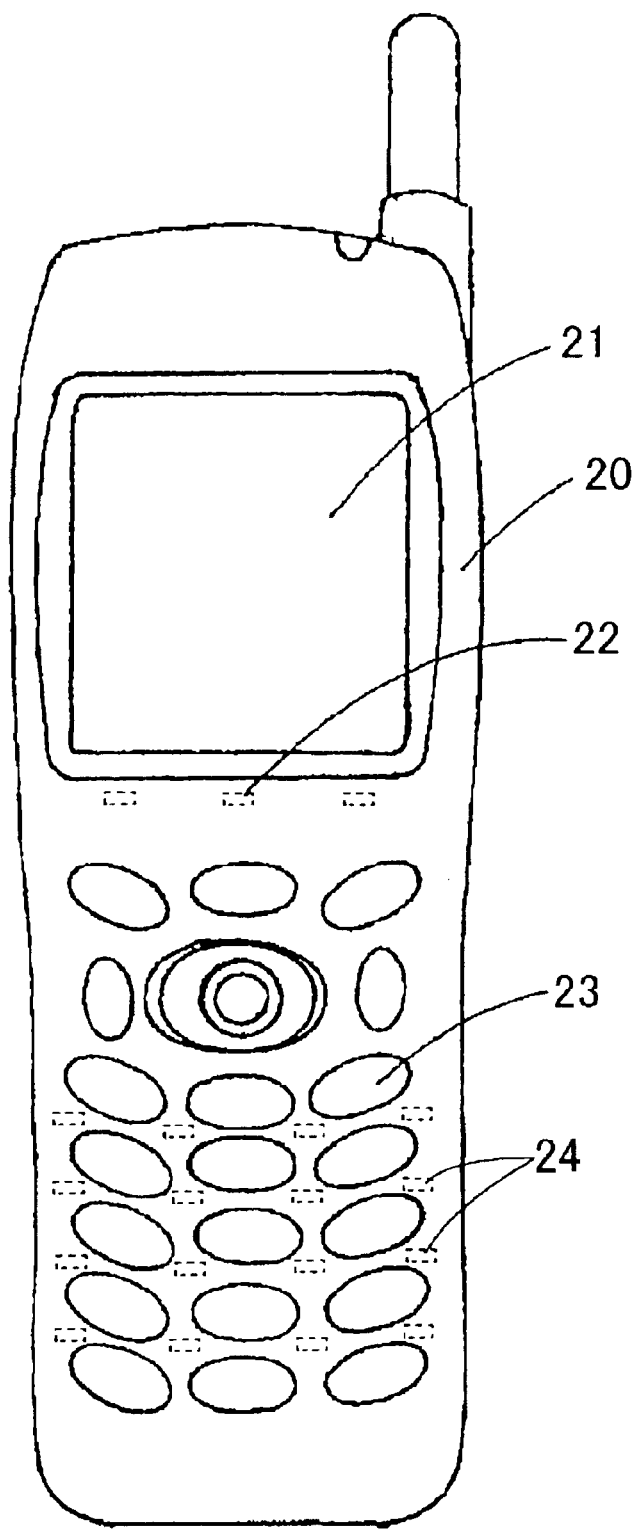
FIG. 7 is a plan view showing a conventional portable telephone.

FIG. 5 shows a portable telephone in which LED devices are provided, and FIG. 6 is a sectional view taken along a line VI—VI of FIG. 5. The portable telephone has an LCD 11 in an upper portion of a case 10 and a plurality of key switches 13 at a lower portion thereof. There is provided three double-faced LED devices 1A between the LCD 11 and the key switch portion as an edge light for illuminating panels 14A and 14B.

As shown in FIG. 6, each of the double-faced LED devices is 1A has an LED device 4A and an LED device 4B provided for emitting light rays in the opposite directions. The LED device 4A is provided as an edge light for the illuminating panel 14A as back light of the key switch portion, and the LED device 4B is provided for the illuminating panel 14B for the LCD 11. In accordance with the double-faced LED device, the LCD and the key switches can be illuminated by different color light rays.

From the foregoing, it will be understood that the present invention provides, double-faced LED devices which may illuminate a number of displays with a small number of LED devices.

While the invention has been described in conjunction with preferred specific embodiment thereof, it will be understood that this description is intended to illustrate and not limit the scope of the invention, which is defined by the following claims.

What is claimed is:

1. A double-faced LED device comprising:
    a substrate having opposed faces;
    a central recess formed in each of the opposed faces;
    a pair of electrode layers formed on each of the opposed faces;

each electrode layer having a surface within the central recess formed into a reflector surface; and an LED securely mounted on the electrode layers within the central recess of each of the opposed faces, to which electric current may be applied to emit light from both of the opposed faces, wherein the reflector surface of each central recess has a cone shape.

2. The LED device according to claim 1, wherein the substrate has a square shape with four corners, and corner recesses at each of the four corners, an electrode layer being formed on surfaces of the corner recesses.

3. The LED device according to claim 1, wherein each central recess is charged with a transparent resin.

4. The LED device according to claim 3, wherein the transparent resin includes a fluorescent agent.

5. The LED device according to claim 1, wherein each central recess is closed by a transparent resin sheet.

6. The LED device according to claim 5, wherein the transparent sheet includes a fluorescent agent.

7. The LED device according to claim 1, wherein each central recess is closed by a transparent glass.

8. The LED device according to claim 7, wherein the transparent glass includes a fluorescent agent.

* * * * *